(12) United States Patent
Seyama

(10) Patent No.: US 10,497,590 B2
(45) Date of Patent: Dec. 3, 2019

(54) ELECTRONIC COMPONENT HANDLING UNIT

(71) Applicant: SHINKAWA LTD., Tokyo (JP)

(72) Inventor: Kohei Seyama, Tokyo (JP)

(73) Assignee: SHINKAWA LTD., Tokyo (JP)

( * ) Notice: Subject to any disclaimer, the term of this patent is extended or adjusted under 35 U.S.C. 154(b) by 0 days.

(21) Appl. No.: 16/068,360

(22) PCT Filed: Nov. 29, 2016

(86) PCT No.: PCT/JP2016/085287
§ 371 (c)(1),
(2) Date: Jul. 5, 2018

(87) PCT Pub. No.: WO2017/119216
PCT Pub. Date: Jul. 13, 2017

(65) Prior Publication Data
US 2019/0006211 A1   Jan. 3, 2019

(30) Foreign Application Priority Data

Jan. 6, 2016   (JP) .................................. 2016-001043

(51) Int. Cl.
*H01L 21/67*   (2006.01)
*H01L 23/00*   (2006.01)

(52) U.S. Cl.
CPC ........ *H01L 21/67144* (2013.01); *H01L 24/75* (2013.01); *H01L 2224/7565* (2013.01);
(Continued)

(58) Field of Classification Search
CPC ......... B63B 27/16; B63B 25/28; B63B 27/30; B63B 25/004; B63B 38/00;
(Continued)

(56) References Cited

U.S. PATENT DOCUMENTS

| 4,322,198 A | * | 3/1982 | Zuber | ................... B21C 47/24 |
| | | | | 242/406 |
| 5,507,614 A | * | 4/1996 | Leonov | ............. H01L 21/67775 |
| | | | | 414/768 |

(Continued)

FOREIGN PATENT DOCUMENTS

JP   H11067879   3/1999
JP   4840862    12/2011
(Continued)

OTHER PUBLICATIONS

"International Search Report (Form PCT/ISA/210) of PCT/JP2016/085287," dated Feb. 14, 2017, with English translation thereof, pp. 1-2.

*Primary Examiner* — Lynn E Schwenning
(74) *Attorney, Agent, or Firm* — JCIPRNET

(57) ABSTRACT

The electronic component handling unit comprises: a main body; a rotating shaft attached to the main body; a flip head attached to the rotating shaft; and a stepping motor attached to the main body, and causing the rotating axis to rotate to invert the flip head. The flip head has: a base connected to the rotating shaft; and a plurality of pickup nozzles attached on the base in a straight line in such a manner that the alignment direction is tilted 45° with respect to the direction in which the rotating axis extends. As a result, a column of picked-up semiconductor chips can be flipped-over while simultaneously changing the alignment direction thereof with a simple constitution.

2 Claims, 10 Drawing Sheets

(52) U.S. Cl.
CPC ........... *H01L 2224/75252* (2013.01); *H01L 2224/75301* (2013.01); *H01L 2224/75702* (2013.01); *H01L 2224/75744* (2013.01); *H01L 2224/75745* (2013.01); *H01L 2224/75822* (2013.01); *H01L 2224/75824* (2013.01)

(58) Field of Classification Search
CPC ........... B63B 2025/285; B65D 88/129; B65D 88/78; B66C 1/223; B66C 1/101
USPC ....... 414/763, 754, 758, 768, 769, 772, 776, 414/777, 779
See application file for complete search history.

(56) References Cited

U.S. PATENT DOCUMENTS

| | | | | |
|---|---|---|---|---|
| 7,047,632 B2* | 5/2006 | Arikado | ............ | H01L 21/67144 29/825 |
| 8,166,637 B2* | 5/2012 | Blessing | ........... | H01L 21/67132 29/720 |
| 8,662,818 B2* | 3/2014 | Wilke | .................... | G02B 21/34 414/754 |

FOREIGN PATENT DOCUMENTS

| | | |
|---|---|---|
| JP | 2012023230 | 2/2012 |
| JP | 2015060924 | 3/2015 |

* cited by examiner

ELECTRONIC COMPONENT HANDLING UNIT

CROSS-REFERENCE TO RELATED APPLICATION

This application is a 371 application of the international PCT application serial no. PCT/JP2016/085287, filed on Nov. 29, 2016, which claims the priority benefit of Japan application no. 2016-001043, filed on Jan. 6, 2016. The entirety of each of the abovementioned patent applications is hereby incorporated by reference herein and made a part of this specification.

TECHNICAL FIELD

The present invention relates to a structure of an electronic component handling unit used in an electronic component mounting apparatus which mounts electronic components such as semiconductor chips on a circuit board.

BACKGROUND ART

As a method of mounting semiconductor chips on a circuit board, a flip-chip bonding method is frequently used. In this method, bumps are formed on a semiconductor chip by soldering or the like, the semiconductor chip is picked up from a wafer and inverted, a surface of the semiconductor chip on a side opposite to the bumps is adsorbed by a bonding tool, and the bumps of the semiconductor chip are thermo-compression bonded to electrodes of a circuit board using the bonding tool to bond the bumps to the electrodes of the circuit board (see, for example, Patent Literature 1).

A flip-chip bonder (flip-chip bonding apparatus) is used as an apparatus for mounting a semiconductor chip onto a circuit board using such a flip-chip bonding method (see, for example, Patent Literature 2). As illustrated in FIG. 8, a flip-chip bonder 900 described in Patent Literature 2 includes a chip supply unit 901 which supplies a semiconductor chip 910 to be mounted on a circuit board 912, a pickup unit 902 which picks up the semiconductor chip 910 from a wafer 911, an inversion mechanism 903 which inverts the picked up semiconductor chip 910, a bonding unit 904 which receives the inverted semiconductor chip 910 and bonds the inverted semiconductor chip 910 to the circuit board 912, a camera 908 which captures images of the circuit board 912 and the semiconductor chip 910, and a conveying unit 915 which conveys the circuit board 912. The chip supply unit 901, the pickup unit 902, the inversion mechanism 903, and the bonding unit 904 are disposed in a line in a Y direction. The chip supply unit 901 includes a push-up unit 909 which pushes up the semiconductor chip 910 to be picked up. Further, the pickup unit 902 includes a pickup tool 905 which adsorbs the semiconductor chip 910 and a pickup head 902a which drives the pickup tool 905 in a Z direction, and the bonding unit 904 includes a bonding tool 906 which bonds the semiconductor chip 910 and a bonding head 904a which drives the bonding tool 906 in the Z direction. The pickup head 902a and the bonding head 904a are moved in the Y direction by a Y direction drive mechanism 907.

CITATION LIST

Patent Literature

[Patent Literature 1]
 Japanese Patent No. 4840862
[Patent Literature 2]
 Japanese Unexamined Patent Application, First Publication No. 2015-60924

SUMMARY OF INVENTION

Technical Problem

Incidentally, in recent years, there has been strengthening demand for space-saving regarding an installation area for a flip-chip bonding apparatus and speeding up of bonding. As a method of realizing this, it is conceivable to use a flip-chip bonding apparatus 950 as illustrated in FIG. 9 different from Patent Literature 1 and Patent Literature 2. In FIG. 9, portions the same as those in FIG. 8 are denoted by the same reference signs and description thereof will be omitted. In the flip-chip bonding apparatus 950 illustrated in FIG. 9, two bonding heads 904a and two bonding tools 906 as well as two pickup heads 902a and two pickup tools 905 are mounted, and a chip supply unit 901, a pickup unit 902, and an X direction drive mechanism 957 for moving the pickup heads 902a in an X direction are disposed on a negative side in a Y direction of a conveying unit 915. The two pickup heads 902a are disposed to be aligned in the X direction along the X direction drive mechanism 957, and the two bonding heads 904a are disposed to be aligned in the Y direction along a Y direction drive mechanism 907. Further, as illustrated in FIG. 10, an inversion mechanism 953 includes an inverting unit 953a which inverts the pickup heads 902a and a rotating unit 953b which rotates the inverted pickup head 902a by 90° in a horizontal plane.

Referring to FIG. 10, an operation of the flip-chip bonding apparatus 950 to which a conventional technology different from Patent Literature 1 and Patent Literature 2 is applied will be briefly described. As illustrated in FIGS. 10(a) and 10(c), first, the two pickup heads 902a are moved in the X direction, and semiconductor chips 910 are respectively picked up by the pickup tools 905. After picking up the semiconductor chips 910, the two pickup heads 902a move in the X direction to the inversion mechanism 953. At this time, the two pickup heads 902a and the two pickup tools 905 are aligned in the X direction. As illustrated in FIGS. 10(b) and 10(c), the inversion mechanism 953 inverts the two pickup heads 902a and the two pickup tools 905 around an X axis by 180° by the inverting unit 953a, and rotates an alignment direction of the two pickup heads 902a and the two pickup tools 905 by 90° in the Y direction from the X direction using the rotating unit 953b. The bonding tools 906 of the two bonding heads 904a disposed to be aligned in the Y direction move in the Y direction to a position of the inversion mechanism 953 and receive the semiconductor chips 910 from the two pickup tools 905. Then, the two bonding heads 904a move in the Y direction to a predetermined bonding position, and then bond the respective semiconductor chips 910 that have been adsorbed to the two bonding tools 906 to the circuit board 912.

As described above, in the flip-chip bonding apparatus 950 to which the conventional technology described in Patent Literature 2 is applied, an arrangement direction of the bonding tools 906 and an arrangement direction of the pickup tools 905 are different, and in order to deliver the semiconductor chips 910 from the pickup tools 905 to the bonding tools 906, it is necessary to match the arrangement directions therebetween by inverting the pickup heads 902*a* and the pickup tools 905 by the inverting unit 953*a* while rotating the pickup heads 902*a* and the pickup tools 905 by 90° by the rotating unit 953*b*. However, when such a rotating unit 953*b* is provided, there is a problem in that the inversion mechanism 953 is complicated.

Therefore, it is an objective of the present invention to provide an electronic component handling unit capable of inverting a picked up a semiconductor chip row and simultaneously changing an arrangement direction thereof with a simple configuration.

Solution to Problem

An electronic component handling unit of the present invention includes a main body, a rotating shaft attached to the main body, and a flip head attached to the rotating shaft and in which a plurality of pickup nozzles adsorbing and holding semiconductor dice are disposed in a straight line, in which the plurality of pickup nozzles are arranged to be inclined by about 45° with respect to a direction in which the rotating shaft extends.

In the electronic component handling unit of the present invention, it is preferable to include a linear drive mechanism which moves the main body in a linear direction, in which the rotating shaft is attached to the main body so that the direction in which the rotating shaft extends is inclined by about 45° with respect to a movement direction of the main body.

Advantageous Effects of Invention

The present invention can provide an electronic component handling unit capable of inverting a picked up semiconductor chip row and simultaneously changing an arrangement direction thereof with a simple configuration.

DESCRIPTION OF EMBODIMENTS

Hereinafter, embodiments of the present invention will be described with reference to the drawings. First, a flip-chip bonding apparatus 100 which is an electronic component mounting apparatus in which an electronic component handling unit 30 of an embodiment of the present invention is mounted will be described with reference to FIG. 1.

Figure 1:
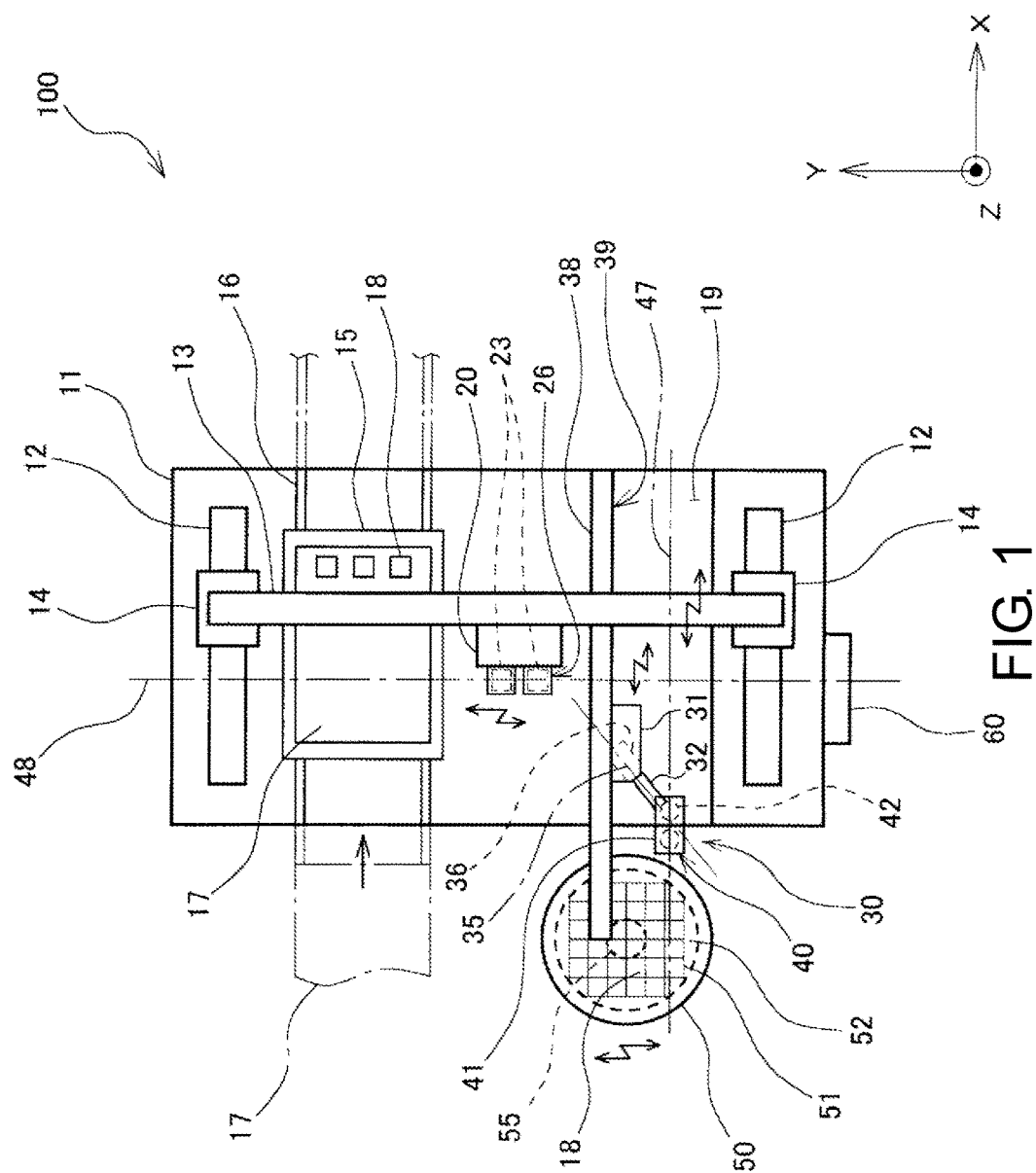
FIG. 1 is a plan view illustrating a configuration of a flip-chip bonding apparatus in which an electronic component handling unit of an embodiment of the present invention is mounted.

As illustrated in FIG. 1, the flip-chip bonding apparatus 100 includes a frame 11, a mounting stage 15, a gantry frame 13 extending in a Y direction across and above the mounting stage 15 and moving in an X direction, a mounting head 20 attached to the gantry frame 13 and moving in the Y direction, a mounting nozzle 26 attached to the mounting head 20 and configured to move a mounting tool 23 in a Z direction, a wafer holder 50, the electronic component handling unit 30 which performs picking up, inverting, and delivering of a semiconductor chip 18, and a control unit 60 which controls an operation of each unit. As illustrated in FIG. 1, description will be made assuming that a direction in which the gantry frame 13 extends is the Y direction, a direction perpendicular thereto is the X direction, and a vertical direction perpendicular to an XY plane is the Z direction.

The mounting stage 15 vacuum-adsorbs a circuit board 17, on which a semiconductor chip 18 which is an electronic component is mounted, to a surface thereof, and heats the circuit board 17 adsorbed to the surface using a heater (not illustrated) provided therein. The mounting stage 15 is fixed to the frame 11. The mounting stage 15 is connected to a conveying rail 16 that conveys the circuit board 17 from a substrate supply unit (not illustrated) onto the mounting stage 15 and sends the circuit board 17 on which mounting of the semiconductor chip 18 has been completed to a product stock (not illustrated).

The gantry frame 13 is a gate-shaped frame, and leg portions thereof are fixed onto a slider 14 that slides in the X direction on two guide rails 12 fixed onto the frame 11 and extending in the X direction. Since the slider 14 is moved in the X direction by an X direction drive motor (not illustrated), the gantry frame 13 is moved in the X direction by the X direction drive motor.

Figure 2:
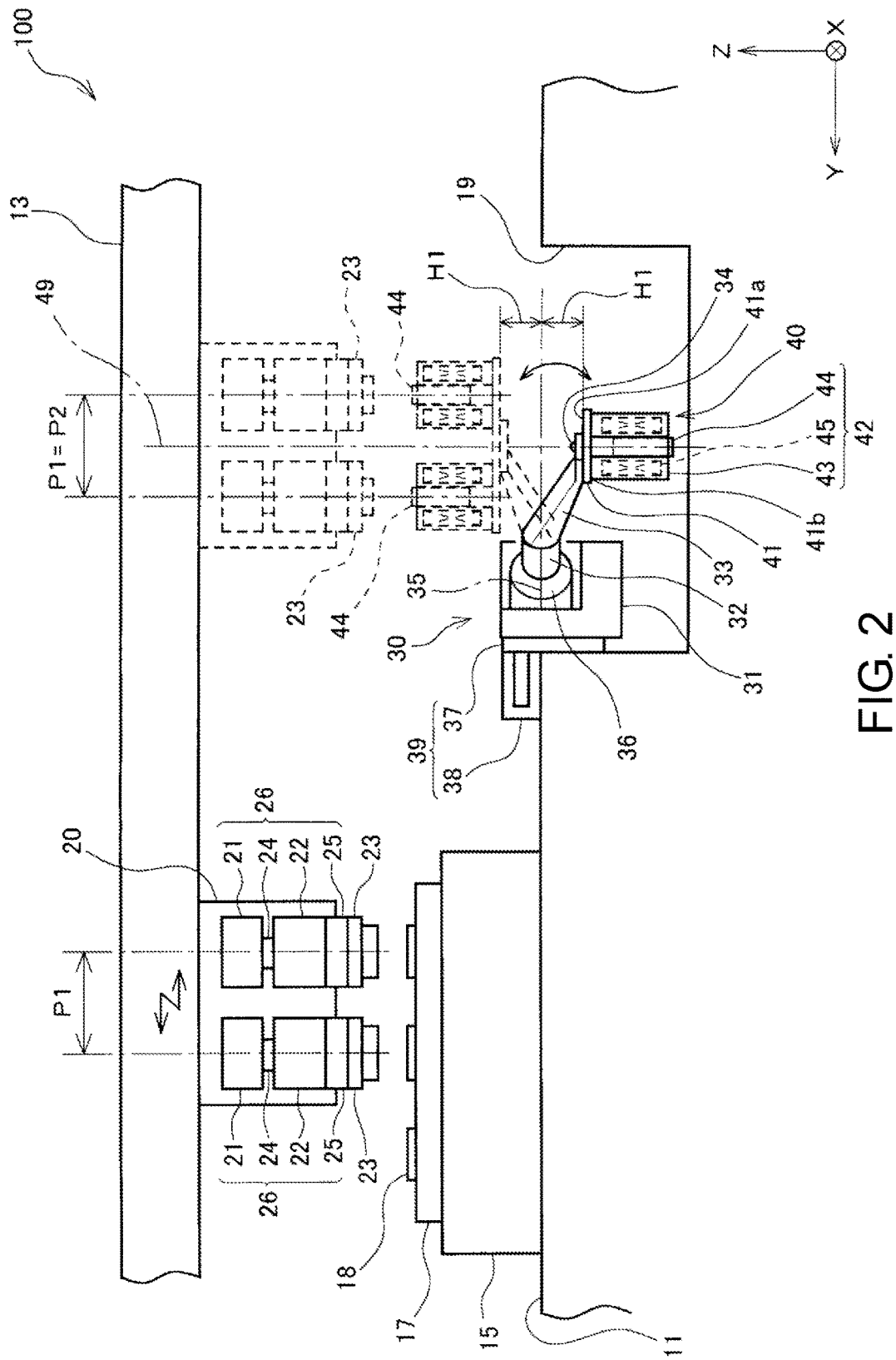
FIG. 2 is an elevational view illustrating a configuration of the flip-chip bonding apparatus in which the electronic component handling unit of the embodiment of the present invention is mounted.

As illustrated in FIG. 2, the mounting head 20 is attached to the gantry frame 13 and is moved in the Y direction by a Y direction drive motor (not illustrated). When the gantry frame 13 is moved in the X direction by the X direction drive motor, since the mounting head 20 is moved in the X direction together with the gantry frame 13, the mounting head 20 is moved in a horizontal direction (X and Y directions) by the X direction drive motor and the Y direction drive motor. Two mounting nozzles 26 are aligned at a pitch P1 in the Y direction and attached to the mounting head 20. Each of the mounting nozzles 26 includes a motor 21 fixed to the mounting head 20, a base portion 22 attached to the mounting head 20 to be movable in the Z direction, a ball screw 24 which drives the base portion 22 in the Z direction in accordance with rotation of the motor 21, and a pulse heater 25 attached to a lower side of the base portion 22. The mounting tool 23 which adsorbs the semiconductor chip 18 and thermo-compression bonds the semiconductor chip 18 onto the circuit board 17 is attached to a lower side of the pulse heater 25. A vacuum hole which vacuum-adsorbs the semiconductor chip 18 is provided at a center of the mounting tool 23. When the base portion 22 is moved in the Z direction by the motor 21, the mounting tool 23 also moves in the Z direction accordingly. Further, the pitch P1 of the two mounting nozzles 26 is the same as a pitch P2 of two pickup nozzles 42 mounted on the electronic component handling unit 30 to be described below.

Although the mounting head 20 is movable in the X and Y directions, description below will be made assuming that a center of the mounting tool 23 moves in the Y direction on a dashed-dotted line 48 illustrated in FIG. 1 when the mounting head 20 moves in the Y direction.

The wafer holder 50 is an annular member that holds a diced wafer 51. As illustrated in FIG. 1, the wafer holder 50 is moved in the Y direction by the Y direction drive motor (not illustrated). A push-up unit 55 that pushes the semiconductor chip 18 of the wafer 51 upward is disposed under the wafer holder 50. The push-up unit 55 is moved in the X direction by the X direction drive motor (not illustrated).

Figure 3:
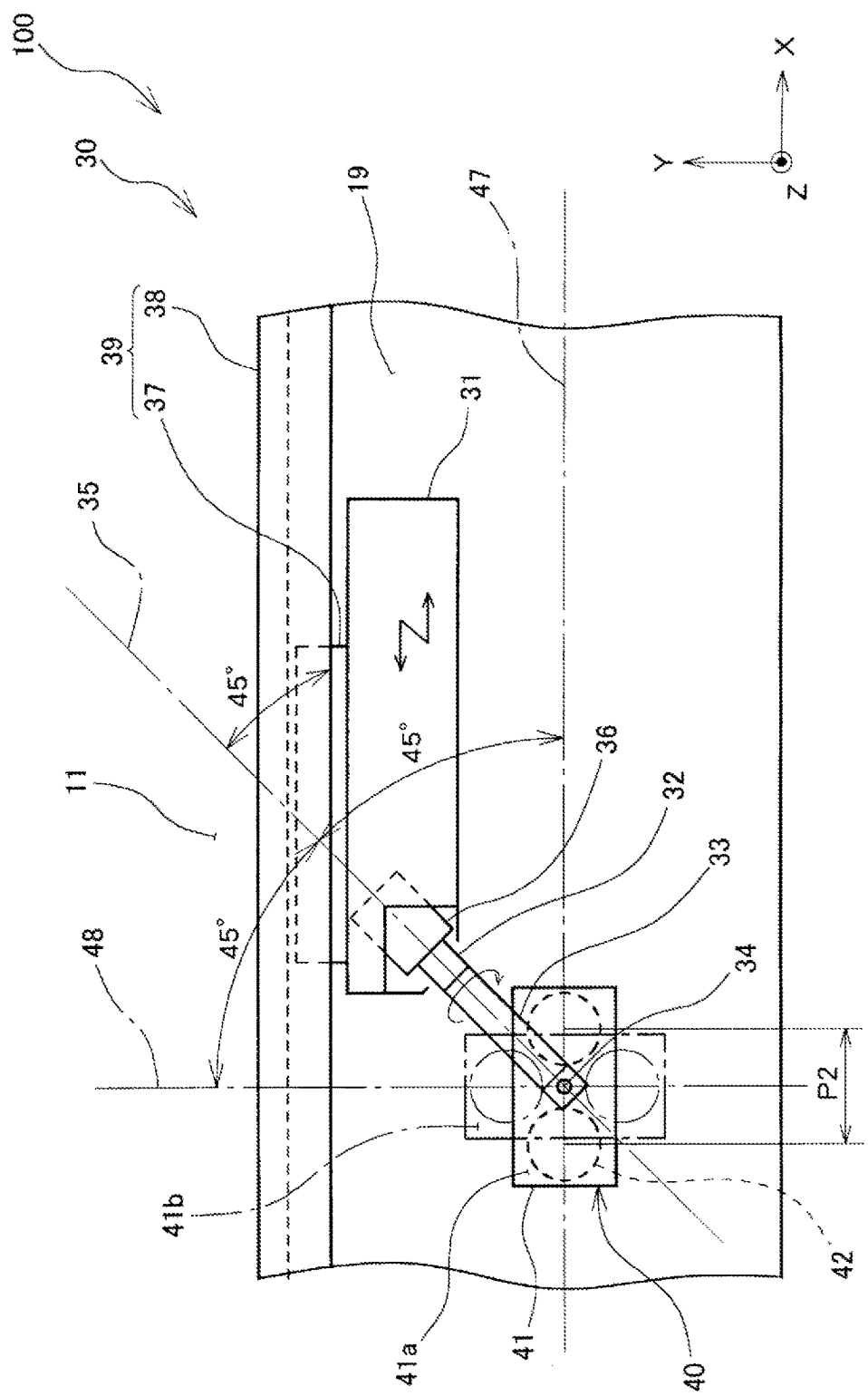
FIG. 3 is a plan view of the electronic component handling unit of the embodiment of the present invention.
Figure 4:
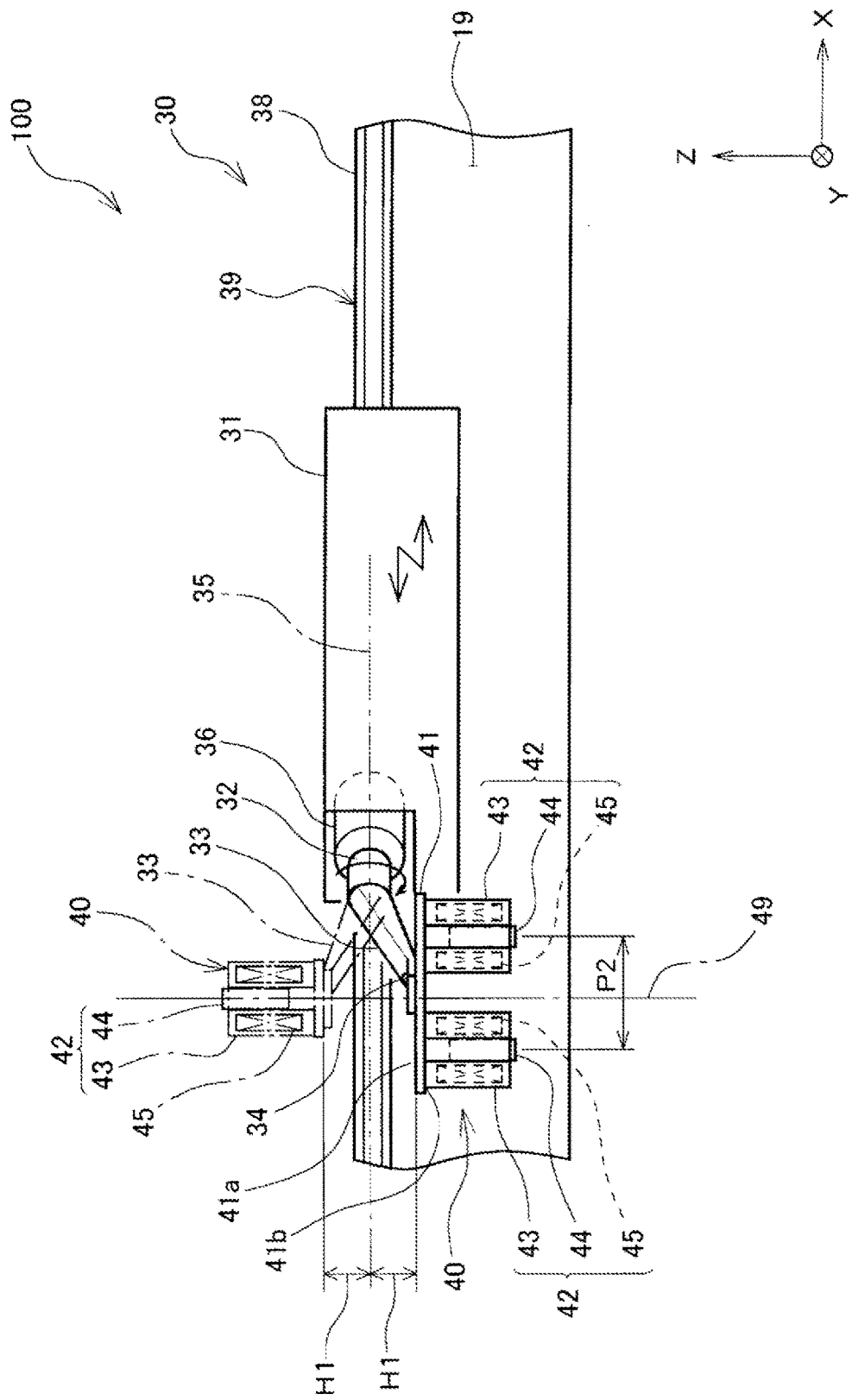
FIG. 4 is an elevational view of the electronic component handling unit of the embodiment of the present invention.

As illustrated in FIGS. 3 and 4, the electronic component handling unit 30 includes a guide rail 38 fixed to a groove 19 extending in the X direction of the frame 11, a slider 37 guided by the guide rail 38 to move in the X direction, a main body 31 fixed to the slider 37 and moving in the X direction together with the slider 37, a rotating shaft 32 attached to the main body 31, a mounting arm 33 attached to the rotating shaft 32 and extending obliquely downward in the Z direction from a central line 35 of the rotating shaft 32, a flip head 40 fixed to a distal end of the mounting arm 33 with a bolt 34, and a stepping motor 36 serving as an inversion drive mechanism which rotates the rotating shaft 32 to invert the flip head 40. Since a stator is disposed at the guide rail 38 and a mover is disposed at the slider 37, the guide rail 38 and the slider 37 constitute an X direction linear motor 39 serving as a linear drive mechanism which drives the main body 31 in the X direction.

As illustrated in FIG. 4, the flip head 40 includes a base 41 and two pickup nozzles 42 attached to a lower surface 41b of the base 41 in the Z direction. The base 41 is a plate-shaped member fixed to the distal end of the mounting arm 33 with the bolt 34, and the two pickup nozzles 42 are fixed to the lower surface 41b of the base 41 to be linearly aligned at the pitch P2 in the X direction with respect to a central line 49 of the flip head 40 in the Z direction. Further, in FIGS. 3 and 4, the flip head 40 illustrated by a solid line illustrates a case in which the pickup nozzles 42 face downward (a state in which an upper surface 41a of the base 41 can be seen), and the flip head 40 illustrated by a dashed-dotted line illustrates a case in which the flip head 40 is inverted, and thereby the lower surface 41b faces upward in the Z direction and the pickup nozzles 42 also face upward. In FIG. 3, a dashed-dotted line 47 illustrates an arrangement direction of the two pickup nozzles 42 when the pickup nozzles 42 face downward. As illustrated in FIG. 3, the arrangement direction of the pickup nozzles 42 (a direction in which the dashed-dotted line 47 extends) is inclined by 45° in an X axis direction from the central line 35 (a direction in which the rotating shaft 32 extends) of the rotating shaft 32. When the main body 31 is moved in the X direction by the X direction linear motor 39, the two pickup nozzles 42 move in the X direction on the dashed-dotted line 47. Further, since the direction in which the dashed-dotted line 47 extends is the X direction and the main body 31 moves in the X direction, the extending direction of the rotating shaft 32 is also inclined by 45° with respect to a movement direction of the main body 31.

As illustrated in FIGS. 2 and 4, since the mounting arm 33 extends obliquely downward in the Z direction from the central line 35 of the rotating shaft 32 and the base 41 is fixed to the distal end thereof with the bolt 34, the upper surface 41a of the base 41 is at a position lower than the center (the central line 35) of the rotating shaft 32 by a height H1 when the pickup nozzles 42 face downward.

As illustrated in FIG. 4, each of the pickup nozzles 42 includes a casing 43 having a columnar shape and provided with a hole extending in a longitudinal direction at a center thereof, and a pickup tool 44 moving through the hole that is provided in the casing 43 in the longitudinal direction. An electromagnetic coil 45 is provided in the casing 43, and an extension amount of the pickup tool 44 from an end surface of the casing 43 can be changed by energizing the electromagnetic coil 45. Further, the pickup tool 44 has a vacuum hole provided at a center and the semiconductor chip 18 can be vacuum-adsorbed to a distal end surface thereof.

As illustrated by a solid line in FIGS. 3 and 4, when the rotating shaft 32 is rotated by 180° by the stepping motor 36 from a state in which the pickup tool 44 faces downward, the base 41 connected to the rotating shaft 32 is rotated by 180° around the rotating shaft 32, resulting in inversion such as the upper surface 41a becoming a lower side in the Z direction and the lower surface 41b becoming an upper side in the Z direction. Thereby, the pickup tool 44 also is in a state of facing upward in the Z direction as illustrated by the dashed-dotted line in FIGS. 3 and 4. When the base 41 is inverted, contrary to what has been described above, the arrangement direction of the pickup nozzles 42 is in a direction illustrated by the dashed-dotted line 48 in a direction inclined by 45° in a Y axis direction from the central line 35 (a direction in which the rotating shaft 32 extends) of the rotating shaft 32. In this way, when the rotating shaft 32 rotates by 180° and the base 41 is inverted, an arrangement direction of the pickup tool 44 is rotated by 90° from the X direction in the Y direction. Further, as illustrated in FIGS. 2 and 4, when the base 41 is inverted, the upper surface 41a of the base 41 to which the mounting arm 33 is fixed is at a position higher than the central line 35 of the rotating shaft 32 by a height H1. Therefore, as illustrated in FIG. 2, a distance between the pickup tool 44 and the mounting tool 23 becomes short when the flip head 40 is inverted, and the extension amount of the pickup tool 44, to be described below, when delivering the semiconductor chip 18 from the pickup tool 44 to the mounting tool 23 can be decreased.

The motor 21, the stepping motor 36, the X direction drive motor, the Y direction drive motor, and the like of the flip-chip bonding apparatus 100 configured as described above are all controlled by the control unit 60. The control unit 60 is a computer in which a central processing unit (CPU) performing arithmetic processing and a storage unit storing operation programs or operation data are included. Hereinafter, an operation of the flip-chip bonding apparatus 100 will be described with reference to FIGS. 5 to 7.

As illustrated by a solid line in FIGS. 3 and 4, the control unit 60 moves the pickup tool 44 to above the wafer holder 50 by the X direction linear motor 39 in a state in which the pickup tool 44 faces downward. Then, as illustrated in (a) of FIG. 5, the control unit 60 performs position adjustment so that a central position of one of the pickup nozzles 42 is right above the semiconductor chip 18 to be picked up. Further, the control unit 60 performs position adjustment so that a position of the push-up unit 55 is just below the semiconductor chip 18 to be picked up.

Next, the control unit 60 energizes the electromagnetic coil 45 of the pickup nozzle 42 to extend a distal end surface of the pickup tool 44 downward, and simultaneously pushes up the semiconductor chip 18 from below a dicing sheet 52 by the push-up unit 55. Further, the control unit 60 connects a vacuum device (not illustrated) to the pickup tool 44 to bring the vacuum hole of the pickup tool 44 into a vacuum state. Then, the semiconductor chip 18 pushed up by the push-up unit 55 and in contact with the distal end surface of the pickup tool 44 comes into contact with the distal end surface of the pickup tool 44 and is vacuum-adsorbed to the distal end surface of the pickup tool 44. When the semiconductor chip 18 is picked up by the pickup tool 44, the control unit 60 controls an energizing current of the electromagnetic coil 45 such that the distal end surface of the pickup tool 44 is retracted until the semiconductor chip 18 is brought into close proximity with the end surface of the casing 43 as illustrated in (b) of FIG. 5.

Figure 5:
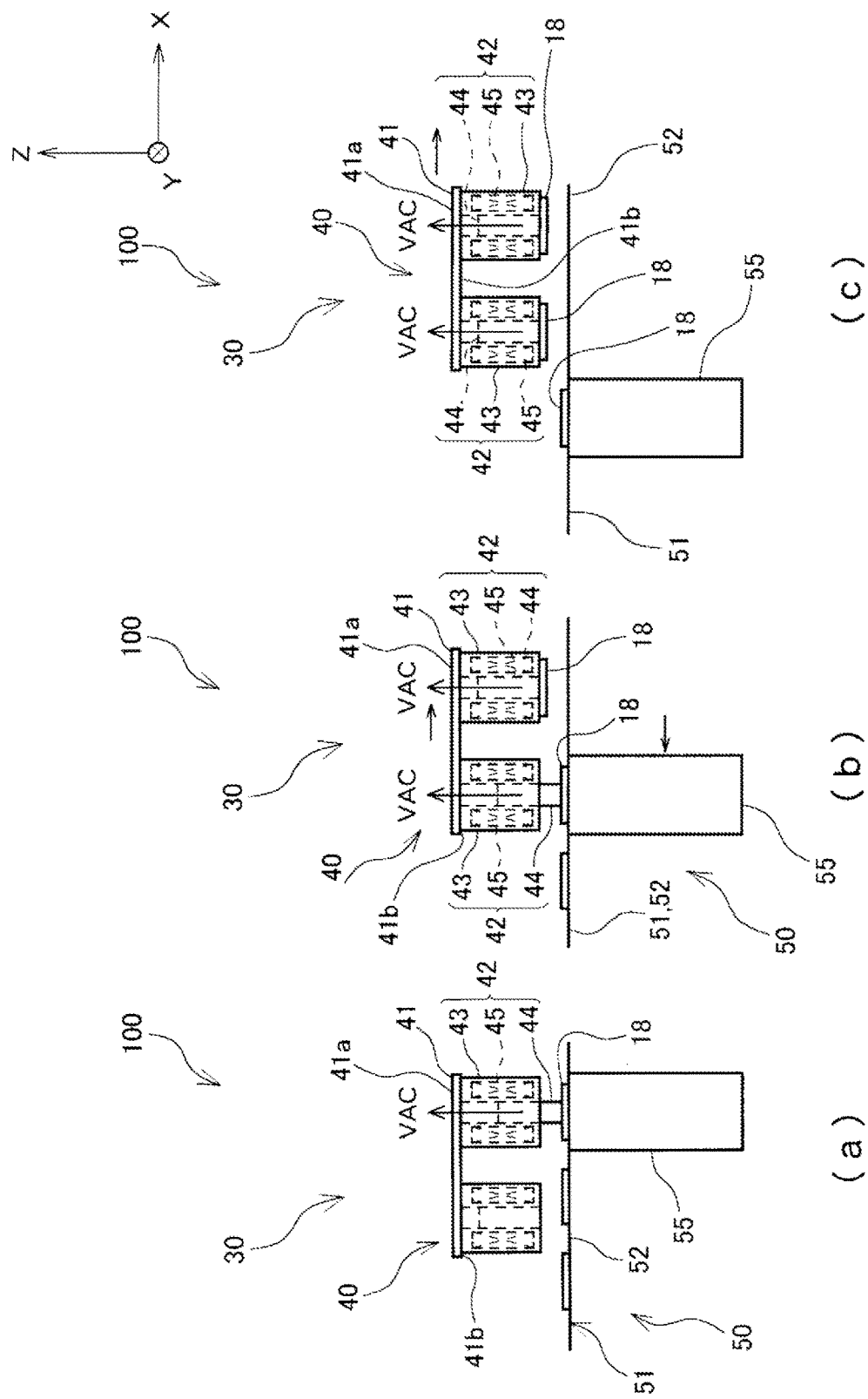
FIG. 5 is an explanatory view illustrating an operation of picking up a semiconductor chip by the electronic component handling unit of the embodiment of the present invention.

Next, as illustrated in (b) of FIG. 5, the control unit 60 drives the X direction linear motor 39 illustrated in FIG. 3 to move the flip head 40 in the X direction and performs position adjustment so that a position of another pickup tool 44 is right above the semiconductor chip 18 to be picked up next and a position of the push-up unit 55 is just below the semiconductor chip 18 to be picked up next. Then, as in the previous operation, the control unit 60 energizes the electromagnetic coil 45 of the pickup nozzle 42 such that the pickup tool 44 protrudes downward, and simultaneously pushes up the semiconductor chip 18 from below the dicing sheet 52 by the push-up unit 55 so that the next semiconductor chip 18 is vacuum-adsorbed to the distal end surface of the pickup tool 44. When the next semiconductor chip 18 is picked up by the pickup tool 44, the control unit 60 controls the energizing current of the electromagnetic coil 45 such that the distal end surface of the pickup tool 44 is retracted until the semiconductor chip 18 is brought into close proximity with the end surface of the casing 43 as illustrated in (c) of FIG. 5.

When two semiconductor chips 18 are picked up by the two pickup nozzles 42, the control unit 60 moves the electronic component handling unit 30 in the X direction using the X direction linear motor 39 illustrated in FIG. 3. Accordingly, as illustrated in (c) of FIG. 5 and (a) of FIG. 6, the two pickup nozzles 42 to which the semiconductor chips 18 are vacuum-adsorbed also move in the X direction. At this time, the two pickup nozzles 42 of the flip head 40 move in the X direction on the dashed-dotted line 47 as described with reference to FIG. 3.

Figure 6:
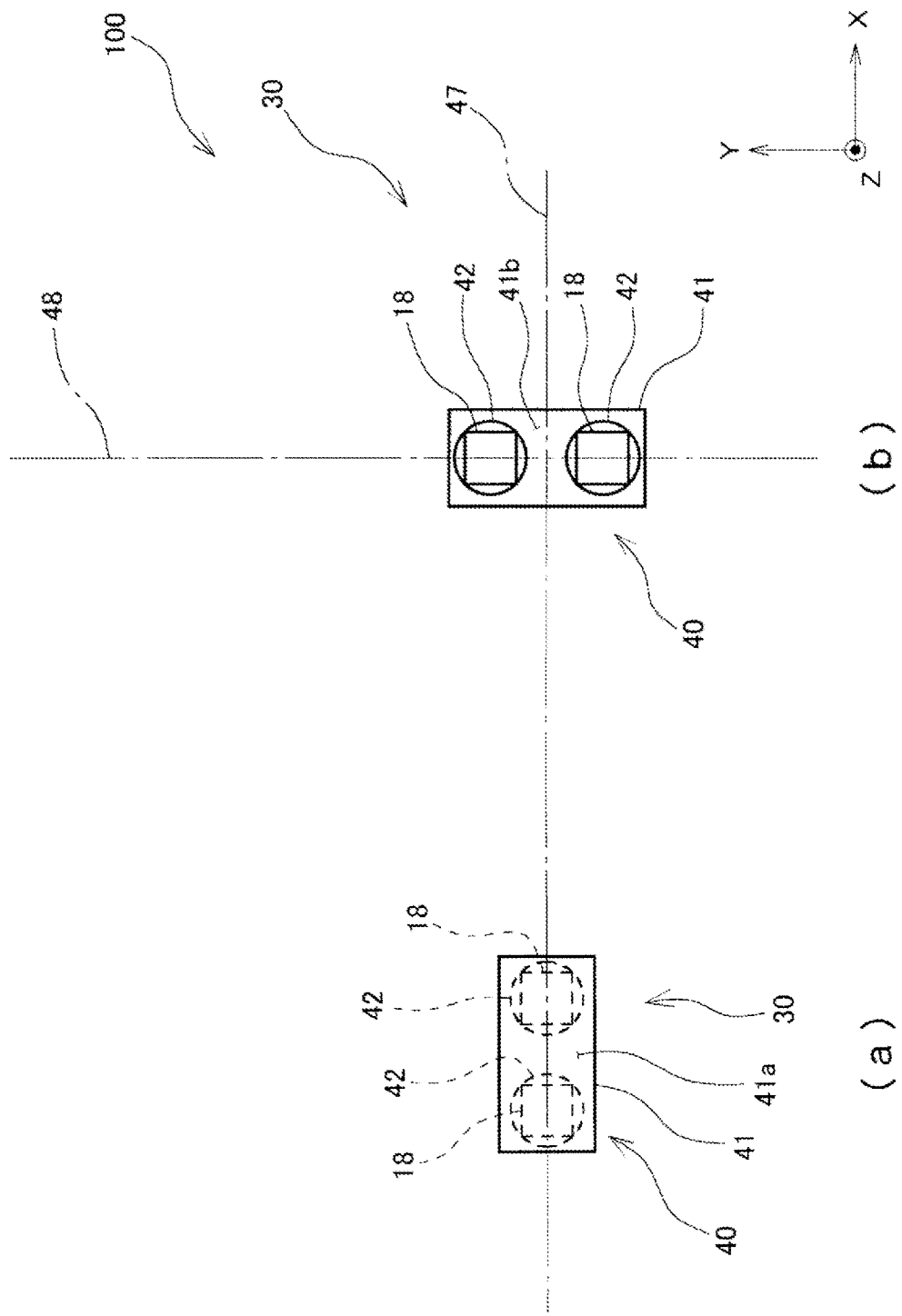
FIG. 6 is an explanatory view illustrating an operation of inverting a semiconductor chip by the electronic component handling unit of the embodiment of the present invention.

When the flip head 40 is moved to a position to be inverted, as described above, the control unit 60 rotates the rotating shaft 32 by 180° by the stepping motor 36 illustrated in FIGS. 3 and 4 to invert the flip head 40. Then, as described above with reference to FIGS. 3 and 4, the base 41 is inverted and the two pickup nozzles 42 are turned upward. Further, as illustrated in (b) of FIG. 6, the arrangement direction of the two pickup nozzles 42 is the Y direction rotated by 90° from the X direction before the inversion. The dashed-dotted line 48 in (b) of FIG. 6 is a line illustrating the arrangement direction of the two pickup nozzles 42 after the flip head 40 is inverted, and is also a line along which a center of the two mounting tools 23 moves in the Y direction when the two mounting tools 23 move in the Y direction.

Figure 7:
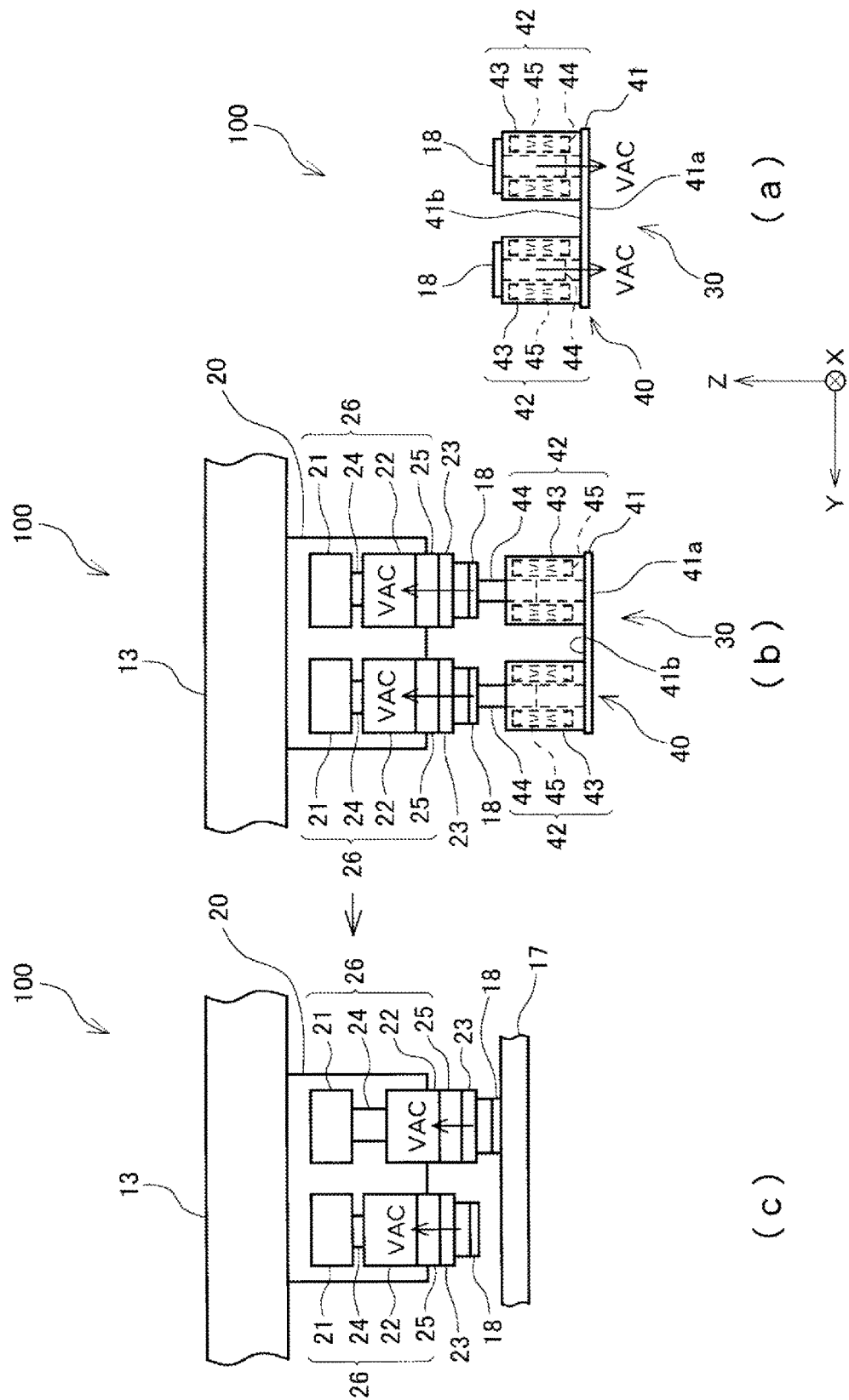
FIG. 7 is an explanatory view illustrating an operation of delivering a semiconductor chip from the electronic component handling unit of the embodiment of the present invention to a bonding tool, and an operation of bonding the semiconductor chip.
Figure 8:
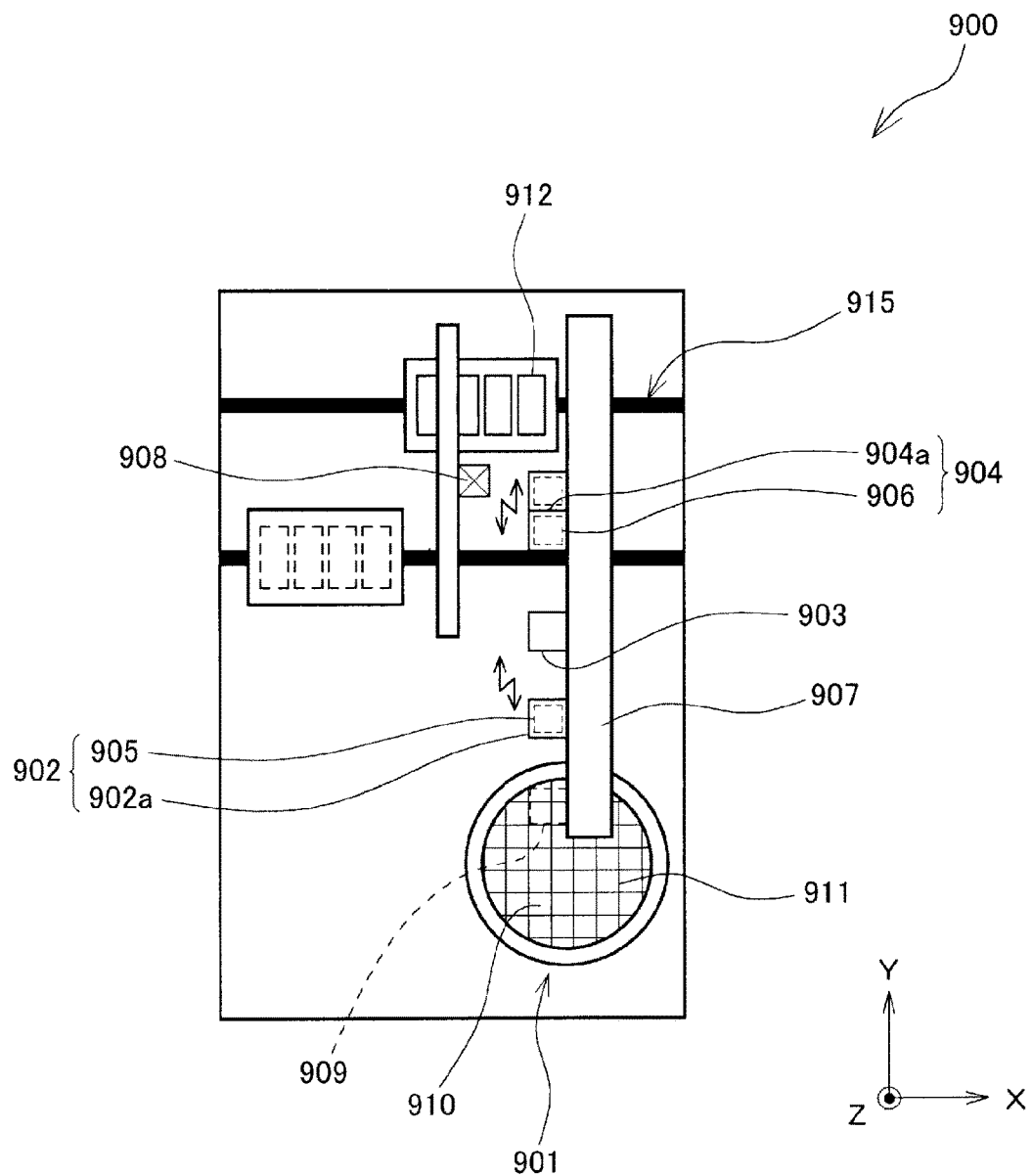
FIG. 8 is a plan view illustrating a flip-chip bonder according to a conventional technology.
Figure 9:
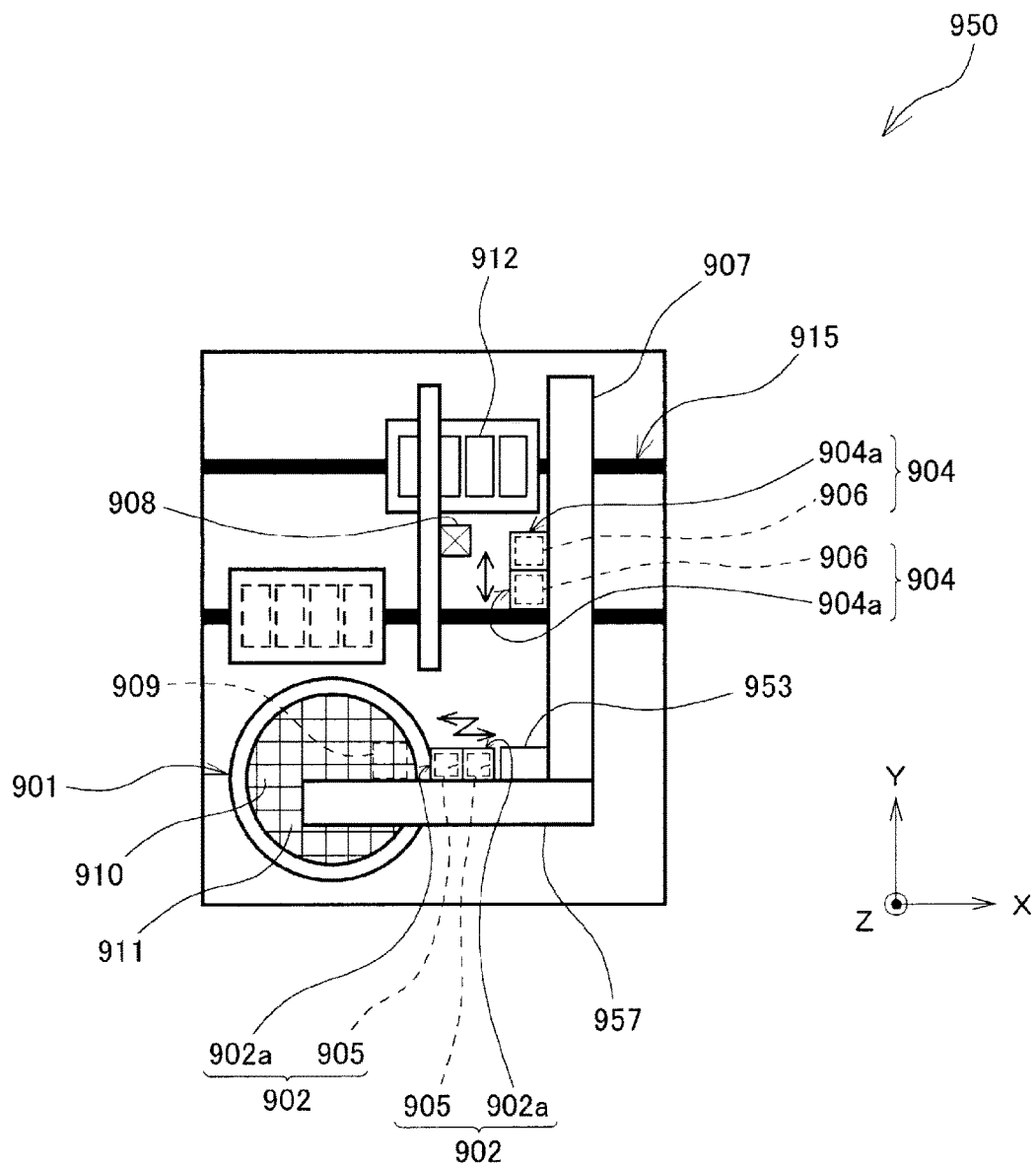
FIG. 9 is a plan view illustrating another flip-chip bonder according to a conventional technology.
Figure 10:
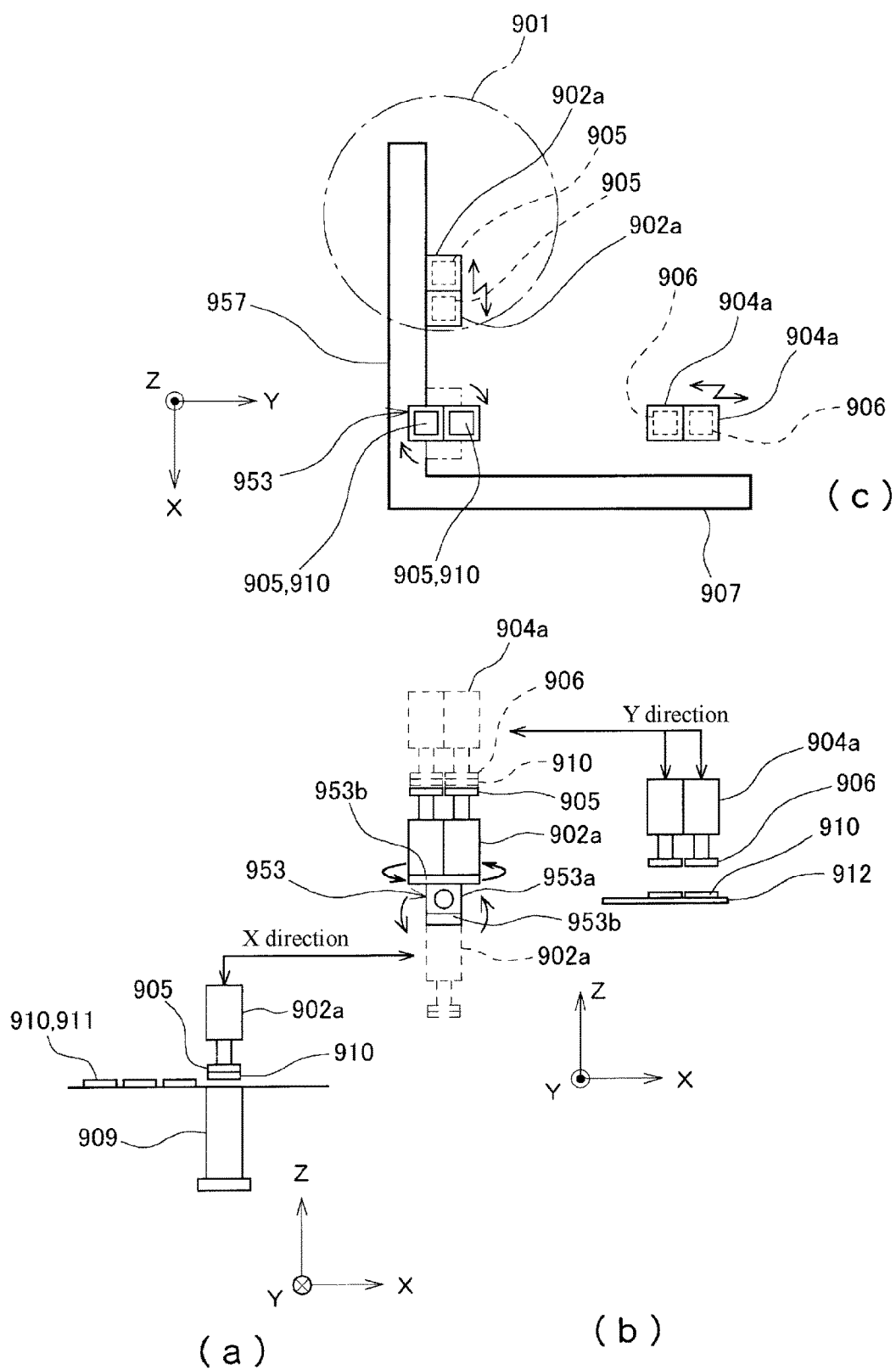
FIG. 10 is an explanatory view illustrating an operation of the flip-chip bonder illustrated in FIG. 9.

As illustrated in (a) of FIG. 7, in a state in which the flip head 40 is inverted, the distal end surface of the pickup tool 44 is in a retracted state, and the semiconductor chip 18 is vacuum-adsorbed to the distal end surface of the pickup tool 44.

When the flip head 40 is inverted as illustrated by a broken line in FIG. 2, the control unit 60 operates the Y direction drive motor such that the mounting head 20 is moved to right above the inverted flip head 40 as illustrated in FIG. 2. At this time, the centers of the two mounting tools 23 move in the Y direction along the dashed-dotted line 48 illustrated in FIGS. 1 and 6. As described above, since the pitch P1 of the two mounting nozzles 26 is the same as the pitch P2 of the two pickup nozzles 42, when the mounting head 20 comes right above the inverted pickup nozzles 42 as illustrated in FIG. 2, center positions of the two mounting tools 23 and center positions of the two pickup tools 44 are respectively coincident with each other.

As illustrated in (b) of FIG. 7, the control unit 60 energizes each electromagnetic coil 45 of each of the pickup nozzles 42 to extend each of the distal end surfaces of the pickup tools 44, As a result, the semiconductor chip 18 adsorbed to the distal end surface of the pickup tool 44 is brought into close proximity with a surface of the mounting tool 23. Then, the control unit 60 releases a vacuum state of the vacuum suction hole of the pickup tool 44, and brings the vacuum hole of the mounting tool 23 into a vacuum state. Then, the semiconductor chip 18 is separated from the distal end surface of the pickup tool 44 and vacuum-adsorbed to the surface of the mounting tool 23. In this manner, the semiconductor chips 18 are delivered from the two pickup tools 44 to the two mounting tools 23.

When the semiconductor chips 18 are delivered from the two pickup tools 44 to the two mounting tools 23, the control unit 60 adjusts a current of the electromagnetic coils 45 of the pickup nozzles 42 to retract the distal end surfaces of the pickup tools 44 to an original state, and rotates the stepping motor 36 by 180° in a direction opposite to the direction at the time of inversion to return the flip head 40 to an original state (non-inverted state) in which the pickup nozzles 42 face downward.

Further, when the two mounting tools 23 receive the semiconductor chips 18, the control unit 60 moves the mounting head 20 to above the circuit board 17 by the Y direction drive motor (not illustrated) as illustrated in (c) of FIG. 7. Then, the semiconductor chip 18 that has been vacuum-adsorbed to each of the mounting tools 23 is heated using the pulse heater 25 of each of the mounting nozzle 26, the motor 21 is rotated to lower the mounting tool 23 together with the base portion 22 onto the circuit board 17, and the semiconductor chip 18 is thermo-compression bonded onto the circuit board 17 by the mounting tool 23. The thermo-compression bonding of the semiconductor chip 18 may be performed one at a time in sequence or two semiconductor chips 18 may simultaneously be thermo-compression bonded to the circuit board 17.

As described above, since the electronic component handling unit 30 of the present embodiment is arranged such that the plurality of pickup nozzles 42 are inclined by 45° with respect to the direction in which the rotating shaft 32 extends, the inversion of the picked up semiconductor chips 18 and the change in arrangement direction of the semiconductor chips 18 by 90° can be simultaneously performed by rotating the rotating shaft 32 by 180°. Therefore, when the electronic component handling unit 30 according to the present embodiment is employed, the flip-chip bonding apparatus 100 having a small installation area can be achieved by causing the arrangement direction of the mounting tools 23 and the arrangement direction of the pickup nozzles 42 of the flip-chip bonding apparatus 100 to be shifted by 90° with a simple structure.

In the above-described embodiment, although the flip head 40 to which the two pickup nozzles 42 are attached has been described, the flip head 40 to which three or more pickup nozzles 42 are attached may be employed as long as the pickup nozzles 42 are arranged in a straight line. Similarly, the mounting nozzles 26 disposed on the mounting head 20 may also be three or more instead of two as long as the mounting nozzles 26 are disposed in parallel. Further, the number of arranged pickup nozzles 42 may be more than the number of arranged mounting nozzles 26.

The present invention is not limited to the embodiments described above, and includes all changes and modifications without departing from the technical scope and spirit of the present invention as defined by the scope of claims.

The invention claimed is:

1. An electronic component handling unit comprising:
   a main body;
   a rotating shaft attached to the main body; and
   a flip head attached to the rotating shaft and in which a plurality of pickup nozzles adsorbing and holding semiconductor dice are disposed in a straight line, wherein
   the plurality of pickup nozzles are arranged in a first arrangement direction or a second arrangement direction, and the first arrangement direction and the second arrangement direction are respectively inclined by about 45° with respect to a direction in which the rotating shaft extends.

2. The electronic component handling unit according to claim 1, comprising:
   a linear drive mechanism that moves the main body in a linear direction, wherein
   the rotating shaft is attached to the main body so that the direction in which the rotating shaft extends is inclined by about 45° with respect to the linear direction.

* * * * *